(12) United States Patent
Ritala et al.

(10) Patent No.: US 6,932,867 B2
(45) Date of Patent: *Aug. 23, 2005

(54) METHOD FOR GROWING THIN OXIDE FILMS

(75) Inventors: Mikko Ritala, Espoo (FI); Antti Rahtu, Espoo (FI); Markku Leskela, Espoo (FI); Kaupo Kukli, Espoo (FI)

(73) Assignee: ASM International, N.V. (NL)

( * ) Notice: Subject to any disclaimer, the term of this patent is extended or adjusted under 35 U.S.C. 154(b) by 68 days.

This patent is subject to a terminal disclaimer.

(21) Appl. No.: 10/618,429

(22) Filed: Jul. 10, 2003

(65) Prior Publication Data

US 2004/0007171 A1 Jan. 15, 2004

Related U.S. Application Data

(63) Continuation of application No. 09/687,355, filed on Oct. 13, 2000, now Pat. No. 6,632,279.

(30) Foreign Application Priority Data

Oct. 14, 1999 (FI) .............................. 19992223

(51) Int. Cl.[7] .............................. C30B 23/06
(52) U.S. Cl. ...................... 117/101; 117/104; 117/106; 117/107; 117/948
(58) Field of Search .............................. 117/101, 104, 117/106, 107, 948

(56) References Cited

U.S. PATENT DOCUMENTS 4,058,430 A  11/1977 Suntola et al.
5,922,405 A  7/1999 Kim et al.
6,037,003 A  3/2000 Gordon et al.
6,258,157 B1  7/2001 Gordon
6,632,279 B1 *  10/2003 Ritala et al. ................. 117/101

FOREIGN PATENT DOCUMENTS

WO  WO 98/46617  10/1998

OTHER PUBLICATIONS

Drozd et al., "Synthesis of oxide superalloys by ML–ALE method." *Applied Surface Science*, vols. 82/83, pp. 587–590 (1994).

Niinisto et al., "Synthesis of oxide thin films and overlayers by atomic layer epitaxy for advanced application," *Materials Science and Engineering*, vol. B41, pp. 23–29 (1996).

Leskela et al., "ALD precursor chemistry: Evolution and future challenges," *J. Phys. IV France*, vol. 9, pp. Pr8–837–Pr8–852 (1999).

Suntola, "Atomic layer epitaxy," *Thin Solid Films*, vol. 216, pp. 84–89 (1992).

* cited by examiner

*Primary Examiner*—Robert Kunemund
(74) *Attorney, Agent, or Firm*—Knobbe, Martens, Olson & Bear LLP

(57) ABSTRACT

A method is provided for growing thin oxide films on the surface of a substrate by alternatively reacting the surface of the substrate with a metal source material and an oxygen source material. The oxygen source material is preferably a metal alkoxide. The metal source material may be a metal halide, hydride, alkoxide, alkyl, a cyclopentadienyl compound, or a diketonate.

18 Claims, 1 Drawing Sheet

METHOD FOR GROWING THIN OXIDE FILMS

The present application claims priority under 35 U.S.C. § 120 as a continuation of U.S. application Ser. No. 09/687,355, filed Oct. 13, 2000 now U.S. Pat. No. 6,632,279, which in turn claims priority under 35 U.S.C. § 119(a) to Finnish patent application number 19992223, filed Oct. 14, 1999.

BACKGROUND OF THE INVENTION

1. Field of the Invention

The present invention relates to the fabrication of oxide films by the Atomic Layer Epitaxy (ALE) process, which is generally also known by the name of Atomic Layer Deposition (ALD). The invention relates in particular to a process for the fabrication of thin oxide films by the ALD method by using an oxygen-containing organometallic compound as the oxygen source material.

2. Description of the Related Art

The continual decrease in size of microelectronics components is leading to a situation in which $SiO_2$ can no longer be used as the gate oxide in metal oxide semiconductor field effect transistors (MOSFET), since, in order to achieve the required capacitances, the $SiO_2$ layer should be made so thin that the tunneling current would grow detrimentally high in terms of the functioning of the component. To avoid this problem, $SiO_2$ has to be replaced with an insulator having a higher dielectric constant. In this case, the insulator may be in a thicker layer than $SiO_2$.

Materials having sufficiently high dielectric constants are numerous, but there is the problem that the insulator must be prepared on top of silicon so that:

either a very thin or no $SiO_2$ layer forms between the silicon and the insulator, which reduces the total capacitance according to the equation $1/C(tot)=1/C(insulator)+1/C(SiO_2)$, there are very few electrically active error states on the interface between the silicon and the insulator, because the charge trapped in them has a negative effect on transistor properties such as threshold voltage, transconductance and stability, and the thickness and uniformity of the insulator are precisely controlled.

Without a thin $SiO_2$ layer on the interface between the silicon and the insulator it is difficult to produce a situation in which there would be very few electrically active error states on the interface. Thus it would be preferable that the structure of the interface would be an Si—$SiO_2$ insulator wherein the thickness of the $SiO_2$ layer would be one or two atom layers.

When an oxide film is deposited on silicon, the surface of the silicon tends to oxidize, forming a $SiO_2$ layer which is too thick. The oxidation of silicon may be due to reactions with the oxygen source used in the process, reactions with the oxide insulator, or diffusion of oxygen. If the insulator selected is a metal oxide thermodynamically more stable than $SiO_2$ (e.g. $ZrO_2$, $HfO_2$, $Al_2O_3$), oxidation can take place only under the effect of the oxygen source used in the deposition process. On the other hand, if the process is carried out at a sufficiently low temperature, the formation of an $SiO_2$ layer may be hindered kinetically even if it were thermodynamically possible.

ALD (ALE, ALCVD) is a process, described, for example, in U.S. Pat. No. 4,058,430, for the growing of thin films. In the process, a thin film is deposited by means of alternating saturated surface reactions. These reactions are implemented by directing gaseous or vaporized source materials alternately into the reactor and by rinsing the reactor with an inert gas between the source material pulses (T. Suntola, Thin Solid Films 215 (1992) 84; Niinistö et al., Materials Science and Engineering B 41 (1996)23). Since the film grows through saturated surface reactions, the growth is self-controlled, in which case controlling the film thickness by the number of reaction cycles is precise and simple. Films deposited by the ALD process are of uniform thickness over even large surface areas, and their conformality is excellent. Process technology and equipment are commercially supplied under the trade mark ALCVD™ by ASM Microchemistry Oy, Espoo, Finland.

The metal source materials used in the oxide processes in ALD are metal compounds of many types, in particular halides, alkoxides, β-diketonates, alkyls, or cyclopentadienyls (for example, M. Leskelä and M. Ritala, Journal de Physique IV 9 (1999) Pr8-837; Niinistö et al., Materials Science and Engineering B 41 (1996)23). The most commonly used oxygen source materials are water, hydrogen peroxide and ozone. Alcohols, oxygen and nitrous oxide have also been used. Of these, oxygen reacts very poorly at the temperatures below 600° C. commonly used, but the other oxygen sources are highly reactive with most of the metal compounds listed above. On the other hand, these oxygen sources may also oxidize the silicon surface, thus producing the excessively thick intermediate layer of $SiO_2$ previously described between the silicon and the oxide film.

The total reaction of a typical pair of source materials, a metal oxide and water, can be presented in the following form

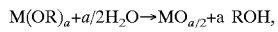

$$M(OR)_a + a/2 H_2O \rightarrow MO_{a/2} + a\ ROH,$$

where M stands for a metal, R is a hydrocarbon, and a is the valence of the metal M. Metal alkoxides may also break down thermally, producing the corresponding metal oxides. However, this is not desirable in the ALD process, because the most important characteristic—self-control of the deposition—is lost through thermal breakdown.

Drozd et al. in their article describe an ALD process in which an oxide made up of oxides of aluminum and chromium is produced by exposing a substrate consisting of a silicon crystal to alternate pulses of chromyl chromide ($CrO_2Cl_2$) and trimethyl aluminum ($Al(CH_3)_3$) (Drozd et al., Applied Surface Science 82/83 (1994)587). However, relatively few metal oxochlorides are volatile at temperatures below 500° C., a fact which limits the usability of processes of this type in particular in applications of the semiconductor industry, where process temperatures above 500° C. are not desirable.

The object of the present invention is to eliminate the problems associated with the prior art and to provide an entirely novel solution to the problem of growing thin oxide films by ALD.

SUMMARY OF THE INVENTION

One aspect of the invention involves a method for growing thin oxide on the surface of a substrate. The surface of the substrate is alternately reacted with a metal source material and an oxygen source material. Advantageously, the oxygen source material is a boron, silicon, or metal compound which has at least one organic ligand and where an oxygen is bonded to at least one boron, silicon or metal atom. According to the first preferred embodiment of the method of the invention, oxygen-containing organometallic compounds $(M(OR)_a)$ are used in the process not only as the oxygen source material but also as a second metal source material. The oxygen-containing organometallic compounds react with the metal compound used as the metal source material. According to the first embodiment of the invention, the same metal is used in the oxygen source material and the metal source material.

According to a second preferred embodiment of the invention, different metals are used, in which case more complicated oxide structures can be grown. According to a third preferred embodiment of the invention, the metal source material also contains oxygen. In this case the source materials are preferably two alkoxides.

According to a fourth preferred embodiment of the invention, a protective layer is deposited on the surface of a readily oxidizing substrate material. The protective layer is typically fewer than 20, preferably fewer than 10, and especially preferably approximately 1–5 atom layers thick. When the substrate has been covered with a film thus deposited, the deposition is continued by some other process, for example, by using water or hydrogen peroxide as the oxygen source material.

According to a fifth preferred embodiment of the invention, the substrate material, typically silicon, is treated in order to remove the native oxide before the growing of the film.

DETAILED DESCRIPTION OF THE PREFERRED EMBODIMENT

The present invention is based on the idea of using in the ALD process oxygen source materials which react well with a metal compound but which are less active as regards the oxidation of the substrate. Such oxygen sources include organometallic compounds in which the oxygen atom(s) is (are) bound to a metal, i.e. compounds which comprise at least one organic ligand and in which the metal atom(s) is (are) bound to oxygen, Metal alkoxides are preferably used.

Considerable advantages are achieved by means of the invention. Owing to the new oxygen source materials, ALD can also be exploited in applications in which present-day oxygen source materials cause problems, for example, by oxidizing the substrate surface, Since oxygen is bound directly to the metal in the metal compounds to which the invention relates, oxidation of the substrate surface presupposes the breaking of the metal-oxygen bond. On the other hand, the metal-oxygen bond can be affected by the selection of the metal and the compound type. Thus, for example, according to the present invention, thin oxide films can be deposited on silicon surfaces by ALD. Volatile organometallic compounds usable as oxygen-containing source materials, in particular metal alkoxides, are known for most metals. Thus the introduction of various metal ions into the oxide structure is possible by the process according to the present invention.

Films can be grown rapidly by the process according to the invention. The typical growth rate is, depending on the deposition temperature and the source materials, approximately 0.1–2 Å, typically 0.5–1.4 Å per cycle.

The properties of the films deposited by the process correspond to those of films deposited by other processes. Thus the dielectric constant of the thin oxide films is sufficient for many uses in microelectronics.

The invention is discussed below in greater detail with the help of the accompanying graphs.

Figure 1:
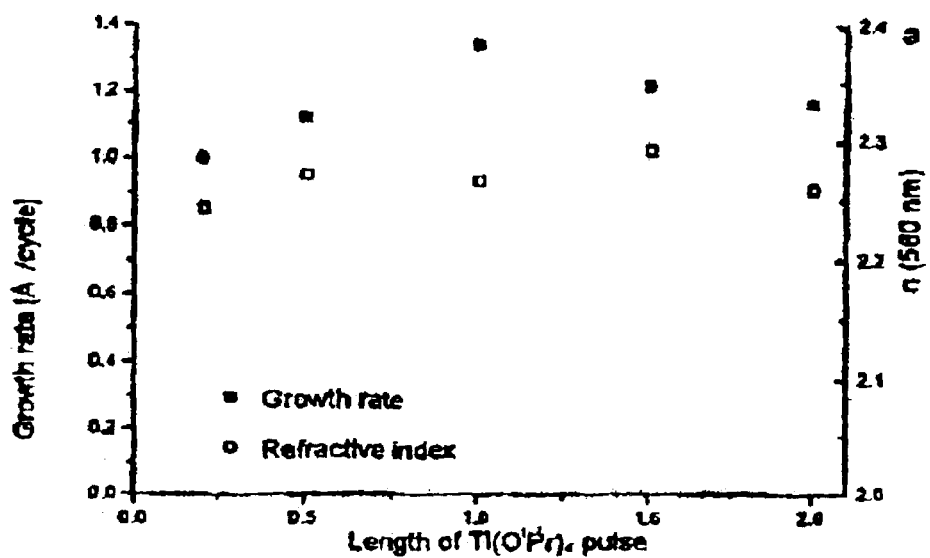
FIG. 1 shows a graph of the growth rate and the refractive index as functions of the $Ti(OCH(CH_3)_2)_4$ pulse time.
Figure 2:
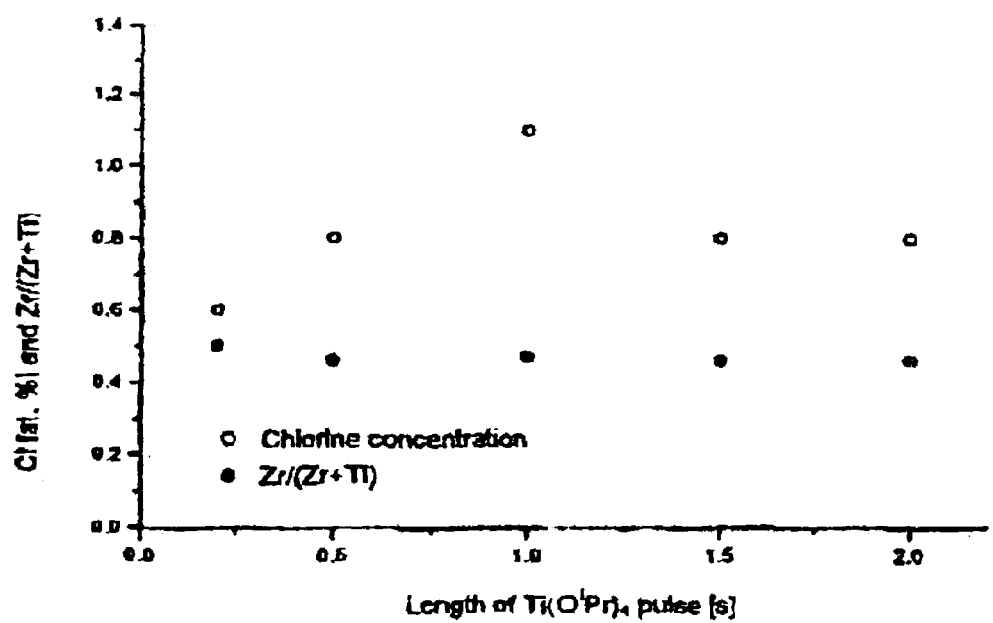
FIG. 2 shows a graph of the $Zr/(Zr+Ti)$ composition ratios and the chlorine residues, determined by the EDX method, as a function of the $Ti(OCH(CH_3)_2)_4$ pulse time.

FIG. 1 shows the growth rate and the refractive index as functions of the $Ti(OCH(CH_3)_2)_4$ pulse time. FIG. 2 shows the $Zr/(Zr+Ti)$ composition ratios and the chlorine residues, determined by the EDX method, as a function of the $Ti(OCH(CH_3)_2)_4$ pulse time.

It is possible to deposit thin oxide films on various surfaces with the embodiments of the method according to the present invention. For example, it is possible to coat glass, iron or steel. Semiconductor materials, such as gallium arsenide (GaAs) and silicon, are also suitable substrates for the film. The advantages of the invention are, however, clearest in the treatment of surfaces the excessive oxidation of which is not desirable and which, however, tend to be oxidized when conventional oxygen source materials are used. Thus, according to a preferred embodiment of the invention, the process is used for depositing thin oxide films on silicon surfaces.

According to the principles of the ALD process, the deposition of a thin film is carried out by means of alternating saturated surface reactions. These reactions are implemented by directing gaseous or vaporized source materials alternately into the reactor and by rinsing the reactor with an inert gas between the source material pulses.

In the option according to the invention, thin oxide films are deposited at a temperature which is so high that, when becoming adsorbed to the substrate surface, a vaporized source material reacts with a molecule layer of a second source material, or that a vaporized source material becomes adsorbed as such and reacts with a second source material directed to the substrate surface in the subsequent step. On the other hand, the temperature should be so low that thermal breakdown of the source material will not occur, or that its significance in terms of the total growth rate of the film is very small. As regards metal alkoxides, this means that the process is carried out at approximately 200–600° C., preferably approximately 250–500° C.

It is required that the source materials used in the ALD process can be vaporized and that they react readily with the other source material or materials selected for the process.

In the context of the present invention, by "metal source material" is meant a source material in which the metal, boron or silicon atom will be in the formed oxide, and by "oxygen source material" is meant a source material which provides the oxygen for the forming oxide. It is, however, to be noted that the oxygen source material preferably serves as a second metal source, in which case the metal or semi-metal present in the oxygen source material is also present as the metal atom in the oxide. On the other hand, the metal source material may also contain oxygen, in which case it can also react into oxide.

By "metal compound" is meant compounds of metals and, for the sake of simplicity, also compounds of boron and silicon. For the same reason, the term "metal" in the context of the present invention covers not only the metals defined in the Periodic Table of the Elements but also boron and silicon.

"Cycle" or "deposition cycle" for its part denotes a sequence wherein a metal source material is fed into the reactor, the reactor is rinsed with an inert gas, an oxygen source material is fed into the reactor, and the reactor is rinsed with an inert gas. Instead of rinsing, the reactor may also be emptied of the preceding source material by pumping before the feeding in of the subsequent source material.

The oxygen source material is an alkoxide, diketonate, triketonate, tropolonate, carboxylate, ester, quinone (in particular orthoquinone complex), catecholate complex or carbamate of any metal in the Periodic Table capable of forming a volatile compound of the type concerned. It is equally possible to use an organic metal compound where at least one group different from the others is bound to the metal.

Preferably the oxygen source material used is a compound according to Formula II $$M_x(OR)_a \quad (II)$$

Formula III $$M_x(OR)_{a-z}Y_z \quad (III)$$

Formula IV $$M_x(OR)_aL_y \quad (IV)$$

or Formula V $$M_x(OR)_{a-z}Y_zL_y \quad (V)$$

In Formulae II–V

M is any metal of the Periodic Table of the Elements, boron and/or silicon, the M's may be mutually the same or different x is an integer describing the number of the M atoms, which number may be 1, 2, 3 or 4, R is a hydrocarbon group, the R's may be the same of different, a is the valence (sum of valences) of the metal(s), boron and/or silicon, z is an integer 1–6, in which case a-z>0, Y is a ligand having a negative charge, but not an alkoxide, L is a neutral adduct ligand which bonds to M by one or several of its atoms, and y is an integer 1–6 and describes the number of bonding ligands.

Formulae II–V are gross formulae. At the molecular level the compounds may be oligomers, such as dimers, trimers, or tetramers.

Metal M thus belongs to group 1, 2, 3, 4, 5, 6, 7, 8, 9, 10, 11 or 12 according to the IUPAC-recommended group classification of the Periodic Table of the Elements, or it is boron, aluminum, silica, gallium, germanium, indium, tin, antimony, thallium, lead, bismuth or polonium. It is to be noted that the metal may also be a lanthanide. Thus the metal may be, for example, lithium, sodium, potassium, rubidium, cesium, francium, beryllium, magnesium, calcium, strontium, barium, radium, scandium, yttrium, lanthanum, cerium, praseodymium, neodymium, promethium, samarium, europium, gadolinium, terbium, dysprosium, holmium, erbium, thulium, ytterbium, lutetium, actinium, thorium, protactinium, uranium, neptunium, plutonium, americium, curium, berkelium, californium, einsteinium, fermium, mendelevium, nobelium, lawrencium, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium or mercury.

Typically it is desired to grow oxides of titanium, zirconium, tantalum, hafnium, niobium, aluminum, silicon, magnesium, calcium, strontium, barium, lead, bismuth or yttrium, or mixtures thereof.

Preferably, oxides of titanium, zirconium, tantalum, hafnium, niobium, aluminum or silicon, or mixtures thereof, are grown.

The same compound may have several atoms of the same metal or several different metal atoms. Typically there are a maximum of four metal atoms and a maximum of two different metals. Preferably there are one or two metal atoms.

R is a substituted or unsubstituted, cyclic, linear or branched, alkyl, alkenyl, aryl, alkylaryl, arylalkyl, alkoxy, thio, amino, cyano or silyl group. Typically R is a linear or branched $C_1$–$C_{10}$ alkyl. Preferably R is ethyl, propyl, isopropyl, butyl, tert-butyl or isobutyl.

According to a preferred embodiment of the invention, the oxygen source material used is a metal alkoxide according to Formula II, specifically a secondary or tertiary alkoxide. Examples of suitable compounds include tantalum pentaethoxide ($Ta(OC_2H_5)_5$), titanium tetraisopropoxide ($Ti(OCH(CH_3)_2)_4$), aluminum triethoxide ($Al(OC_2H_5)_3$), and aluminum tri-isopropoxide ($Al(OCH(CH_3)_2)_3$).

The ligand Y in a compound according to Formulae II and V is preferably β-diketonate or a corresponding sulfur or nitrogen compound, a hydride, an alkyl, in particular methyl, ethyl, propyl or isopropyl, a perfluoroalkyl, halide, amide, alkoxide, carboxylate, Schiff base, cyclopentadienyl or its derivative.

Especially preferably Y is a halide such as fluoride, bromide, chloride or iodide, a hydride, methyl, ethyl, 2,2,6,6-tetramethyl-3,5-heptanedionate, 1,1,1,5,5,5-hexafluoro-2,4-pentanedionate, 1,1,1,2,2,3,3-heptafluoro-7,7-dimethyl-4,6-octanedionate, 4,4'-(ethane-1,2-idyl-imido)bis(pent-3-ene-2-one), pentamethylcyclopentadienyl, 2,4-pentadionate, or 1,1,1-trifluoro-2,4-pentanedionate.

The ligand L in a compound according to Formulae IV and V is preferably (i) a hydrocarbon, (ii) an oxygen-containing hydrocarbon, (iii) a nitrogen-containing hydrocarbon, (iv) a sulfur-containing hydrocarbon, (v) a phosphorus-containing hydrocarbon, (vi) an arsenic-containing hydrocarbon, (vii) a selenium-containing hydrocarbon and/or (viii) a tellurium-containing hydrocarbon.

Most preferably L is, (a) an amine or polyamine (b) a bipyridine (c) a ligand which is described by formula VI

in which formula G is —O—, —S— or NR[1]—, where R[1] is hydrogen or a substituted or unsubstituted, cyclic, linear or branched, alkyl, alkenyl, aryl, alkylaryl, arylalkyl, alkoxy, thio, cyano or silyl group. The cyclic or aromatic ring of R[1] may contain a heteroatom. The ligand presented in Formula VI may also have, bonded to the carbon atoms, either hydrogen or an R[1]-like substituent.

(d) an ether, polyether, thioether or polythioether.

It is to be noted that in the ALD process the metal-oxygen bond will not break but instead the O—R bond, i.e., specifically in the case of alkoxides the oxygen-carbon bond, will break. By a selection of the metal so that the metal-oxygen bond is strong, it is possible to prevent or at least minimize the oxidation of the substrate surface. In general, the metal-oxygen bond is, for example, specifically in alkoxides thermodynamically quite strong; for example, in titanium alkoxides the average Ti—O bond energy is 104 kcal/mol, although it is kinetically labile, enabling ligand exchange reactions to take place.

The metal source material used for the thin oxide film is a compound of any of the abovementioned metals of the Periodic Table of the Elements.

The metal source material is typically a compound according to Formula VII of any of the above-mentioned metals.

$$M'X_b$$

In Formula VII
M' is any metal of the Periodic Table of the Elements or boron or silicon, as stated above,
b is the valence of M', and
X is a negatively charged ligand, for example a halide (F, Cl, Br, I), hydride, alkylamide $NR_2$, alkoxide, aryloxide, alkyl, cyclopentadienyl or β-diketonate. The X's may be mutually the same or different.

The preferred compound type varies according to the metal, but in general halides, in particular chlorides, or alkoxides are most preferably used.

According to the first preferred embodiment of the invention, oxygen-containing organometallic compounds $(M(OR)_a)$ are used in the ALD process not only as the oxygen source material but also a second metal source material. The oxygen-containing organometallic compounds react with the metal compound used as the metal source material:

$$bM(OR)_a + a\ M'X_b \rightarrow M_bM'_aO_{(a+b)/2} + (a+b)RX \quad (VIII)$$

It is to be noted that the metals M and M' may be mutually the same or different. The compounds used may be, for example, a metal alkoxide and an alkyl compound of a metal.

According to the first embodiment of the invention, the same metal is used in the oxygen source material and the metal source material, in which case, for example, $TiO_2$ grows through the following alternating surface reactions:

$$(Đ\text{-}O\text{—})_2Ti(OR)_2 + TiCl_4 \rightarrow (Đ\text{-}O\text{—})_2Ti(\text{—}O\text{—})_2TiCl_2 + 2RCl \quad (IX)$$

$$(Đ\text{-}O\text{—})_2Ti(\text{—}O\text{—})_2TiCl_2 + Ti(OR)_4 \rightarrow (Đ\text{-}O\text{—})_2Ti(\text{—}O\text{—})_2Ti(\text{—}O\text{—})_2Ti(OR)_2 + 2RCl \quad (X)$$

where Đ- indicates the surface and $(Đ\text{-}O\text{—})_2$-Ti(—O—)$_2$Ti(—O—)$_2$Ti(OR)$_2$=(Đ-O—)$_2$Ti (OR)$_2$, i.e., at the end of the two-step reaction cycle the initial state is arrived at with respect to the surface composition so that the film thickness has increased by the amount of the surface composition so that the film thickness has increased by the amount of the unit Ti(—O—)$_2$Ti(—O—)$_2$.

According to a second preferred embodiment of the invention, different metals are used, in which case more complicated oxide structures can be grown. For example, $ZrCl_4$ can be used as the metal source material and an organometallic compound of titanium as the oxygen source material in accordance with Formulae XI and XII.

$$(Đ\text{-}O\text{—})_2Ti(OR)_2 + ZrCl_4 \rightarrow (Đ\text{-}O\text{—})_2Ti(\text{—}O\text{—})_2ZrCl_2 + 2RCl \quad (XI)$$

$$(Đ\text{-}O\text{—})_2Ti(\text{—}O\text{—})_2ZrCl_2 + Ti(OR)_4 \rightarrow (Đ\text{-}O\text{—})_2Zr(\text{—}O\text{—})_2Ti(OR)_2 + 2RCl \quad (XII)$$

According to a third preferred embodiment of the invention, the metal source material also contains oxygen. In this case the source materials are preferably two alkoxides. In a reaction of two alkoxides it is impossible to say which one of the source materials introduces the oxygen into the forming oxide. It is, however, clear that a portion of the oxygen present in the alkoxides, either one of them or both, exits the system without binding to the oxide, for example, as shown in Formula XIII.

$$M(OR)_a + M(OR^1)_a \rightarrow 2MO_{a/2} + a\ ROR^1 \quad (XIII)$$

where $R^1$ stands for the same as R in Formulae II–V above. R and $R^1$ may be mutually the same or different.

One option according to the invention is one wherein two metal alkoxides react with each other, in which case the metals may be mutually different or the same.

According to a fourth preferred embodiment of the invention, by the process according to the invention there is deposited on the surface of a readily oxidizing substrate material a protective layer, typically fewer than 20, preferably fewer than 10, and especially preferably approximately 1–5 atom layers. When the substrate has been covered with a film thus deposited, the deposition is continued by some other process, for example, by using water or hydrogen peroxide as the oxygen source material. The film grown by the other method may be by its structure or composition the same as or different from the protective thin oxide film. By the procedure according to the embodiment it is possible to optimize, for example, the film growth rate and/or the purity of the film.

According to a fifth preferred embodiment of the invention, the substrate material, typically silicon, is treated in order to remove the native oxide before the growing of the film. When the silicon surface is subjected to the treatment, in which it is etched in an HF solution, is rinsed with ion-exchanged water, and is blown dry, the native oxide is removed and the surface becomes hydrogen terminated. Another alternative is to heat the silicon substrate in UHV conditions to such a heat that the native oxide sublimates, leaving a bare silicon surface, whereafter the substrate is transferred inertly, without exposure to air, to the ALE reactor, where an oxide film is deposited on it by the process according to the invention.

The following examples describe the invention in greater detail.

EXAMPLE 1

$Ta_2O_5$ films were grown in a flow-type F-120 ALE reactor (ASM Microchemistry Oy) at temperatures of 275 and 325° C. The source materials used were tantalum pentachloride ($TaCl_5$) and tantalum pentaethoxide ($Ta(OC_2H_5)_5$). $TaCl_5$ was vaporized in the reactor by heating it to 90° C., and $Ta(OC_2H_5)_5$ respectively at 105° C.

The growing of $Ta_2O_5$ films was implemented according to the principle of the ALE process by means of alternate $TaCl_5$ and $Ta(OC_2H_5)_5$ pulses. The durations of the pulses were 0.3 s ($TaCl_5$) and 0.7 s ($Ta(OC_2H_5)_5$), and the subsequent rinsing times were respectively 0.2 s and 1.0 s. The deposition temperatures were 275 and 325° C.

The films grew at rates of 0.13 Å/cycle (275° C.) and 0.5 Å/cycle (325° C.). According to XRD measurements they were amorphous. According to TOF-ERDA (Time-of-Flight Elastic Recoil and Detection Analysis) and EDX (Energy dispersive x-ray spectroscopy) measurements, a 160 nm thick film grown at 275° C. contained approximately 6.0 at. % chlorine, and its permittivity as measured from the structure ITO/Ta$_2$O$_5$/Al (ITO=indium-tin oxide) was relatively low, 18. Instead, a 250-nm-thick film grown at 325° C. contained less than 3 at. % chlorine, and its permittivity was 23. The refractive indices of the films were 2.08 (275° C.) and 2.17 (325° C.).

EXAMPLE 2

Ti$_x$Zr$_y$O$_z$ films were grown at 300° C. in the ALE reactor mentioned in Example 1. The source materials used were zirconium tetrachloride (ZrCl$_4$) and titanium tetraisopropoxide (Ti(OCH(CH$_3$)$_2$)$_4$). ZrCl$_4$ was vaporized in the reactor by heating it to 170° C. and Ti(OCH(CH$_3$)$_2$)$_4$ respectively at 40° C.

The deposition of the Ti$_x$Zr$_y$O$_z$ films was implemented according to the principle of the ALE process by means of alternating ZrCl$_4$ and Ti(OCH(CH$_3$)$_2$)$_4$ pulses. The duration of the ZrCl$_4$ pulse was maintained constant at 0.2 s, and the length of the Ti(OCH(CH$_3$)$_2$)$_4$ pulse was varied within the range of 0.2–2.0 s. The rinsing time between the pulses was 0.5 s.

FIG. 1 shows how the growth rate, the refractive index, and the Zr/(Zr+Ti) composition ratio and chlorine residues determined by the EDX method changed according to the Ti(OCH(CH$_3$)$_2$)$_4$ pulse time. With Ti(OCH(CH$_3$)$_2$)$_4$ pulses of over 0.5 s, both the growth rate (1.2 Å/cycle) and the composition (Zr/(Zr+Ti)0.45) were constant. The chlorine residues in all the films were below 1 at. %. The growth rate achieved in the process was substantially higher than that achieved in corresponding processes using water as a source material: Ti(OCH(CH$_3$)$_2$)$_4$—H$_2$O 0.3 Å/cycle and ZrCl$_4$—H$_2$O 0.5 Å/cycle.

According to XRD measurements, the films were amorphous. The permittivity measured from the structure ITO/Ti$_x$Zr$_y$O$_z$/Al was 43.

EXAMPLE 3

Al$_2$O$_3$ films were grown by the processes according to Examples 1 and 2 by using as the source materials aluminum trichloride (AlCl$_3$) and either aluminum triethoxide (Al(OC$_2$H$_5$)$_3$) or aluminum tri-isopropoxide (Al(OCH(CH$_3$)$_2$)$_3$). The vaporizing temperatures used were 80° C. (AlCl$_3$), 135° C. (Al(OC$_2$H$_5$)$_3$), and 110° C. (Al(OCH(CH$_3$)$_2$)$_3$). When aluminum ethoxide was used, an Al$_2$O$_3$ film did not grow at 300° C., but at 400° C. a growth rate of 0.7 Å/cycle was achieved. Instead, when aluminum isopropoxide was used, the growth succeeded already at 300° C. at a rate of 0.7 Å/cycle. In each case, approximately 2 at. % of chlorine was left in the films.

EXAMPLE 4

Al$_2$O$_3$ films were grown by the processes according to the preceding examples by using as the source materials two aluminum alkoxides, i.e., aluminum triethoxide and aluminum isopropoxide. The deposition temperature was 300° C. and the growth rate was 1.2 Å/cycle.

EXAMPLE 5

Al$_2$O$_3$ films were grown by the processes according to the preceding examples by using as the source materials trimethyl aluminum (Al(CH$_3$)$_3$) and aluminum tri-isopropoxide. The deposition temperature was 300° C. and the growth rate obtained was 1.3 Å/cycle.

EXAMPLE 6

Zr$_x$Si$_y$O$_z$ films were grown by the processes according to the preceding examples by using as the source materials ZrCl$_4$ (vaporization temperature 170° C.) and silicon tetraethoxide (Si(OC$_2$H$_5$)$_4$), the latter being fed into the reactor from an external, thermostatically controlled (45° C.) source via heated pipes. The deposition temperature was 500° C., in which case the growth rate obtained with source material pulses of 1.0 s and rinsing of 0.5 s was 0.5 Å/cycle, and the films contained approximately 20 at. % of zirconium, 13 at. % of silicon, 64 at. % of oxygen, 2 at. % of chlorine and less than 0.1 at. % of carbon and hydrogen.

What is claimed is:

1. An atomic layer deposition process for growing thin oxide films on a surface of a substrate comprising alternately reacting the surface of the substrate with a metal source material and an oxygen source material, wherein the oxygen source material is a boron, silicon or metal compound which has at least one organic ligand and wherein an oxygen is bonded to at least one boron, silicon or metal atom.

2. A process according to claim 1, wherein the oxygen source material serves as a second metal source material.

3. A process according to claim 1, wherein the substrate for the film is a silicon surface.

4. A process according to claim 1, wherein the oxygen source material used is a compound according to gross Formula II–V $$M_x(OR)_a \qquad (II)$$

$$M_x(OR)_{a-z}Y_z \qquad (III)$$

$$M_x(OR)_a L_y \qquad (IV)$$

$$M_x(OR)_{a-z}Y_z L_y \qquad (V)$$

wherein

M is any metal of the Periodic Table of the Elements, boron and/or silicon, the M's may be mutually the same or different.

x is an integer describing the number of M atoms, which number may be 1, 2, 3 or 4, R is a hydrocarbon group, the R's may be the same or different, a is the valence (sum of valences) of the metal(s), boron and/or silicon M, z is an integer 1–6, in which case a-z>0, Y is a ligand having a negative charge, but not an alkoxide, L is a neutral adduct ligand which bonds to M by one or several of its atoms, and y describes the number of the bonding ligands.

5. A process according to claim 4, wherein the metal M is selected from the group consisting of group 1, 2, 3, 4, 5, 6, 7, 8, 9, 10, 11 or 12 of the Periodic Table of the Elements, boron, aluminum, silicon, gallium, germanium, indium, tin, antimony, thallium, lead, bismuth, and polonium.

6. A process according to claim 4, wherein R is a substituted or unsubstituted, cyclic, linear or branched group selected from the group consisting of an alkyl, alkenyl, aryl, alkylaryl, arylalkyl, alkoxy, thio, amino, cyano, and a silyl group.

7. A process according to claim 6, wherein R is a linear or branched C$_1$–C$_{10}$ alkyl.

8. The process according to claim 7, wherein R is selected from the group consisting of an ethyl, propyl, isopropyl, butyl, tert-butyl and an isobutyl group.

9. A process according to claim 4, wherein the ligand Y is selected from the group consisting of a diketonate, a corresponding sulfur or nitrogen compound, an alkyl, a perfluoroalkyl, a halide, a hydride, an amide, an alkoxide, a carboxylate, a Shiff base, and a cyclopentadienyl group or its derivative.

10. A process according to claim 4, wherein R is selected from the group consisting of a methyl, an ethyl, a propyl, and an isopropyl group.

11. A process according to claim 4, wherein the ligand L is selected from the group consisting of:
   (i) a hydrocarbon,
   (ii) an oxygen-containing hydrocarbon,
   (iii) a nitrogen-containing hydrocarbon,
   (iv) a sulfur-containing hydrocarbon,
   (v) a phosphorus-containing hydrocarbon,
   (vi) an arsenic-containing hydrocarbon,
   (vii) a selenium-containing hydrocarbon, and
   (viii) a tellurium-containing hydrocarbon.

12. A process according to claim 11, wherein L is selected from the group consisting of:
   (i) an amine or polyamine,
   (ii) a bipyridine
   (iii) a ligand described by the formula

(VI)

in which formula G is —O—, —S— or —NR$^1$, wherein R$^1$ is hydrogen or a substituted or unsubstituted, cyclic, linear or branched, alkyl, alkenyl, aryl, alkylaryl, arylalkyl, alkoxy, thio, cyano or silyl group, and each carbon atom of a ring according to the formula has an R$^1$-like substituent, which are mutually either the same or different,
   (iv) an ether or polyether, an
   (v) a thioether or polythioether.

13. A process according to claim 1, wherein the oxygen source material is selected from the group consisting of an alkoxide, a β-diketonate, a triketonate, a tropolonate, a carboxylate, an ester, a quinone, a catecholate complex, a carbamate, and a compound having two or more of these groups together with any metal of the Periodic Table of the Elements.

14. A process according to claim 1, wherein the oxygen source material is an orthoquinone complex.

15. A process according to claim 11, wherein the oxygen source material is a metal alkoxide.

16. A process according to claim 1, wherein the metal source material is a compound with the formula M'X$_b$, where
   M' is any metal of the Periodic Table of the Elements, boron or silicon,
   b is the valence of M', and
   X is a negatively charged ligand, each X being, independent of the others, where X is selected from the group consisting of a halide (F, Cl, Br, I), a hydride, an alkylamide NR$_2$, an alkoxide, an aryloxide, an alkyl, a cyclopentadienyl, and a β-diketonate.

17. A process according to claim 1, wherein the metal source material is selected from the group consisting of an alkyl compound, a metal halide, and a metal alkoxide.

18. A process according to claim 1, further comprising treating the substrate to remove the native oxide from the surface of the substrate before the growing of the film.

\* \* \* \* \*

UNITED STATES PATENT AND TRADEMARK OFFICE
CERTIFICATE OF CORRECTION

PATENT NO. : 6,932,867 B2
DATED : August 23, 2005
INVENTOR(S) : Ritala et al.

It is certified that error appears in the above-identified patent and that said Letters Patent is hereby corrected as shown below:

Column 1,
Line 6, after "2000" insert -- , --.

Column 5,
Line 30, after "different" insert -- , --.

Column 10,
Line 35, after "different" delete "." and insert -- , --.

Column 12,
Line 1, delete "an" and insert -- and --.

Signed and Sealed this

Second Day of May, 2006

JON W. DUDAS
*Director of the United States Patent and Trademark Office*